United States Patent
Ahmad et al.

(10) Patent No.: US 10,560,040 B2
(45) Date of Patent: *Feb. 11, 2020

(54) HARVESTING ENERGY FROM FLUID FLOW

(71) Applicant: Saudi Arabian Oil Company, Dhahran (SA)

(72) Inventors: Talha Jamal Ahmad, Dhahran (SA); Muhammad Arsalan, Khobar (SA); Michael J. Black, Dhahran (SA); Mohamed Nabil Noui-Mehidi, Dhahran (SA)

(73) Assignee: Saudi Arabian Oil Company, Dhahran (SA)

( * ) Notice: Subject to any disclaimer, the term of this patent is extended or adjusted under 35 U.S.C. 154(b) by 0 days.

This patent is subject to a terminal disclaimer.

(21) Appl. No.: 16/397,099

(22) Filed: Apr. 29, 2019

(65) Prior Publication Data
US 2019/0253006 A1    Aug. 15, 2019

Related U.S. Application Data

(63) Continuation of application No. 15/608,619, filed on May 30, 2017, now Pat. No. 10,367,434.

(51) Int. Cl.
| | | |
|---|---|---|
| *H02N 2/18* | (2006.01) | |
| *H02K 35/04* | (2006.01) | |
| *H01L 41/12* | (2006.01) | |
| *F03B 17/06* | (2006.01) | |

(52) U.S. Cl.
CPC .......... *H02N 2/185* (2013.01); *H01L 41/125* (2013.01); *H02K 35/04* (2013.01); *F03B 17/065* (2013.01)

(58) Field of Classification Search
CPC ....... H02N 2/185; H01L 41/125; H02K 35/04
See application file for complete search history.

(56) References Cited

U.S. PATENT DOCUMENTS

| | | |
|---|---|---|
| 3,448,305 A | 6/1969 | Raynal et al. |
| 3,558,936 A | 1/1971 | Horan |
| 3,663,845 A | 5/1972 | Apstein |
| 3,970,877 A | 7/1976 | Russell et al. |
| 4,387,318 A | 6/1983 | Kolm et al. |
| 4,536,674 A | 8/1985 | Schmidt |
| 5,150,619 A * | 9/1992 | Turner .................. G01F 1/3218 73/861.22 |

(Continued)

FOREIGN PATENT DOCUMENTS

| | | |
|---|---|---|
| DE | 202012103729 | 10/2012 |
| WO | 2009046709 | 4/2009 |

OTHER PUBLICATIONS

International Search Report and Written Opinion issued in International Application No. PCT/US2018/033855 dated Oct. 18, 2018, 14 pages.

(Continued)

*Primary Examiner* — Viet P Nguyen
(74) *Attorney, Agent, or Firm* — Fish & Richardson P.C.

(57) ABSTRACT

The bluff body attaches to an elastic mount and is capable of generate vortex shedding when the elastic mount orients the bluff body in a flow-line traverse to a fluid flow and vibrates in response to the vortex shedding. A harvester is located within the bluff body and is capable of generating power above a specified threshold in response to the vibration.

3 Claims, 6 Drawing Sheets

(56) References Cited

U.S. PATENT DOCUMENTS

| | | | |
|---|---|---|---|
| 5,317,223 | A | 5/1994 | Kiesewetter et al. |
| 5,965,964 | A | 10/1999 | Skinner et al. |
| 6,504,258 | B2 | 1/2003 | Schultz et al. |
| 6,768,214 | B2 | 7/2004 | Schultz et al. |
| 7,199,480 | B2 | 4/2007 | Fripp et al. |
| 7,224,077 | B2 | 5/2007 | Allen |
| 7,242,103 | B2 | 7/2007 | Tips |
| 7,249,805 | B2 | 7/2007 | Cap |
| 7,345,372 | B2 | 3/2008 | Roberts et al. |
| 7,847,421 | B2 | 12/2010 | Gardner et al. |
| 7,906,861 | B2 | 3/2011 | Guerrero et al. |
| 8,047,232 | B2 | 11/2011 | Bernitsas |
| 8,258,644 | B2 | 9/2012 | Kaplan |
| 8,421,251 | B2 | 4/2013 | Pabon et al. |
| 8,426,988 | B2 | 4/2013 | Hay |
| 8,564,179 | B2 | 10/2013 | Ochoa et al. |
| 8,604,634 | B2 | 12/2013 | Pabon et al. |
| 8,638,002 | B2 | 1/2014 | Lu |
| 8,648,480 | B1 | 2/2014 | Liu et al. |
| 8,786,113 | B2 | 7/2014 | Tinnen et al. |
| 8,916,983 | B2 | 12/2014 | Marya et al. |
| 8,925,649 | B1 | 1/2015 | Wiebe et al. |
| 9,091,144 | B2 | 7/2015 | Swanson et al. |
| 9,106,159 | B1 | 8/2015 | Wiebe et al. |
| 9,130,161 | B2 | 9/2015 | Nair et al. |
| 9,239,043 | B1 | 1/2016 | Zeas |
| 9,322,389 | B2 | 4/2016 | Tosi |
| 10,367,434 | B2 | 7/2019 | Ahmad |
| 2006/0086498 | A1 | 4/2006 | Wetzel et al. |
| 2008/0048455 | A1 | 2/2008 | Carney |
| 2008/0277941 | A1* | 11/2008 | Bowles .............. E21B 41/0085 290/54 |
| 2009/0166045 | A1 | 7/2009 | Wetzel et al. |
| 2010/0164231 | A1 | 7/2010 | Tsou |
| 2010/0308592 | A1 | 12/2010 | Frayne |
| 2011/0049901 | A1 | 3/2011 | Tinnen |
| 2011/0273032 | A1* | 11/2011 | Lu .............................. F03D 5/00 310/10 |
| 2012/0292915 | A1 | 11/2012 | Moon |
| 2013/0119669 | A1 | 5/2013 | Murphree |
| 2013/0200628 | A1 | 8/2013 | Kane |
| 2013/0227940 | A1 | 9/2013 | Greenblatt |
| 2014/0167418 | A1 | 6/2014 | Hiejima |
| 2014/0175800 | A1 | 6/2014 | Thorp |
| 2014/0284937 | A1 | 9/2014 | Dudley et al. |
| 2016/0168957 | A1 | 6/2016 | Tubel |
| 2016/0273947 | A1 | 9/2016 | Mu et al. |
| 2017/0033713 | A1 | 2/2017 | Petroni |
| 2018/0351480 | A1* | 12/2018 | Ahmad .................. H02K 35/04 |
| 2019/0253003 | A1* | 8/2019 | Ahmad .................. H01L 41/125 |
| 2019/0253004 | A1* | 8/2019 | Ahmad .................. H01L 41/125 |
| 2019/0253005 | A1* | 8/2019 | Ahmad .................. H01L 41/125 |
| 2019/0253006 | A1* | 8/2019 | Ahmad .................. H01L 41/125 |

OTHER PUBLICATIONS

Fornarelli et al., "Flow patterns and heat transfer around six in-line circular cylinders at low Reynolds number," JP Journal of Heat and Mass Transfer, Pushpa Publishing House, Allahabad, India, Feb. 2015, vol. 11, No. 1; pp. 1-28.

Govardhan et al., "Critical mass in vortex-induced vibration of a cylinder," European Journal of Mechanics B/Fluids, Jan.-Feb. 2004, vol. 23, No. 1; pp. 17-27.

* cited by examiner

HARVESTING ENERGY FROM FLUID FLOW

CROSS-REFERENCE TO RELATED APPLICATIONS

This application is a continuation application of, and claims priority to, U.S. patent application Ser. No. 15/608,619, entitled "HARVESTING ENERGY FROM FLUID FLOW" to inventors Talha Jamal Ahmad, Muhammad Arsalan, Michael J. Black, and Mohamed Nabil Noui-Mehidi, which was filed on May 30, 2017. The disclosure of the foregoing application is incorporated herein by reference in its entirety.

TECHNICAL FIELD

This disclosure relates to energy harvesting from a flow-line.

BACKGROUND

In certain instances, it can be useful to generate power in a wellbore or flow-line. For example, a turbine can be placed in a wellbore or flow-line. A fluid flow through the flow-line can spin the turbine, which then turns a generator or alternator to generate power.

SUMMARY

This disclosure describes technologies relating to harvesting energy from fluid flow.

An example implementation of the subject matter described within this disclosure is an elastic bluff body with the following features. The bluff body attaches to an elastic mount and is capable of generate vortex shedding when the elastic mount orients the bluff body in a flow-line traverse to a fluid flow and vibrates in response to the vortex shedding. A harvester is located within the bluff body and is capable of generating power above a specified threshold in response to the vibration.

Aspects of the example implementation, which can be combined with the example implementation or in combination, include the following. The harvester can vibrate at a resonance frequency of the elastic bluff body.

Aspects of the example implementation, which can be combined with the example implementation or in combination, include the following. The flow-line can include a wellbore.

Aspects of the example implementation, which can be combined with the example implementation or in combination, include the following. The bluff body can include a cylinder.

Aspects of the example implementation, which can be combined with the example implementation or in combination, include the following. The harvester can include a piezoelectric harvester or a magnetostrictive harvester.

Aspects of the example implementation, which can be combined with the example implementation or in combination, include the following. The harvester can include a cantilever beam configured to oscillate in response to the vortex shedding.

Aspects of the example implementation, which can be combined with the example implementation or in combination, include the following. The bluff body can include a substantially conical shape. The bluff body can pivotally connect to the elastic mount. The bluff body can oscillate in response to vortex shedding.

Aspects of the example implementation, which can be combined with the example implementation or in combination, include the following. The bluff body can include a permanent magnet and the harvester include an iron rod and a metallic coil around the iron rod.

Aspects of the example implementation, which can be combined with the example implementation or in combination, include the following. The harvester can include a cylinder with a metallic coil circling a circumference of the cylinder.

Aspects of the example implementation, which can be combined with the example implementation or in combination, include the following. The elastic bluff body can be conical and connect to the elastic mount. The harvester can oscillate in response to the vortex shedding.

Aspects of the example implementation, which can be combined with the example implementation or in combination, include the following. The elastic mount can be a first elastic mount, the bluff body can be a first bluff body, and the harvester can be a first harvester. A second elastic mount can be separate from the first elastic mount. A second bluff body can be attached to the second elastic mount and can generate vortex shedding when the second elastic mount orients the second bluff body in the flow-line traverse to the fluid flow and vibrates in response to the vortex shedding. A second harvester can be located within the second bluff body and can generate power above a specified threshold in response to the vibration.

Aspects of the example implementation, which can be combined with the example implementation or in combination, include the following. The second bluff body and the second harvester can include a substantially identical natural frequency to the first bluff body and the first harvester respectively.

An example implementation of the subject matter described within this disclosure is method with the following features. An oscillating vortex is induced with a bluff body and a harvester within the bluff body in response to flowing a fluid across the bluff body. Electrical power is generated in response to inducing the oscillating vortex.

Aspects of the example method, which can be combined with the example method or in combination, include the following. Generating electrical power can include vibrating a cantilever beam within the bluff body in response to inducing the oscillating vortex. The cantilever beam can include a magnetostrictive harvester or a piezoelectric harvester.

Aspects of the example method, which can be combined with the example method or in combination, include the following. The bluff body can include a substantially conical shape. The bluff body can be pivotally connected to an elastic mount. The bluff body can oscillate in response to vortex shedding.

Aspects of the example method, which can be combined with the example method or in combination, include the following. The electrical power can be stored within a battery or capacitor. A device can be powered by the stored electrical power.

Aspects of the example method, which can be combined with the example method or in combination, include the following. The device can include a sensor or communication device.

An example implementation of the subject matter described within this disclosure is system with the following features. A flow-line houses a fluid. An elastic mount is attached to an inner surface of the flow-line. A cylindrical bluff body is attached to the elastic mount and is capable of generating vortex shedding when the elastic mount orients the bluff body in a flow-line traverse to a fluid flow and vibrates in response to the vortex shedding. A harvester is located within the bluff body. The harvester includes a cantilever beam capable of generating power above a specified threshold in response to the vibration. The cantilever beam includes a piezoelectric or magnetostrictive material. A power rectification and conditioning circuit is coupled to the cantilever beam. An electrical storage device is coupled to the power rectification and conditioning circuit. An electricity using device is coupled to the electrical storage device.

Aspects of the example system, which can be combined with the example system or in combination, include the following. The cylindrical bluff body can be a first cylindrical bluff body, the harvester can a first harvester, and the cantilever beam can be a first cantilever beam. A second cylindrical bluff body configured to be placed transversely within the flow-line, the second cylindrical bluff body can generate an oscillating vortex within the flow-line in response to a fluid flowing across the second cylindrical bluff body. The second bluff body can be positioned downstream and parallel of the first bluff body at a distance appropriate for a synchronous vortex shedding mode. A second harvester can be located within the second cylindrical bluff body. The harvester can include a second cantilever beam that can generate power above a specified threshold in response to the vibration. The cantilever beam can include a piezoelectric or magnetostrictive material.

Aspects of the example system, which can be combined with the example system or in combination, include the following. The power rectification and conditioning circuit can be coupled to the second cantilever beam.

The details of one or more implementations of the subject matter described in this disclosure are set forth in the accompanying drawings and the description below. Other features, aspects, and advantages of the subject matter will become apparent from the description, the drawings, and the claims.

BRIEF DESCRIPTION OF THE DRAWINGS

Like reference numbers and designations in the various drawings indicate like elements.

DETAILED DESCRIPTION

The control lines used in smart completions can present an installation and maintenance challenge. The control lines are used for transmitting power and communicating data to and from downhole equipment. The cable lengths necessary for wellbore installations can extend thousands of feet. Such lengths can incur high costs and can easily be damaged during installation or maintenance operations. Inline turbines have been used to convert mechanical energy of fluid flow through a wellbore into electrical energy, but turbines are mechanical systems with a short lifespan due to their continuously moving parts. Sandy or corrosive fluid environments can shorten a turbine's usable life substantially.

This disclosure describes an elastic bluff-body configuration configured to harvest energy from a fluid-flow induced vibration. For example, one or more elastic bluff-body configurations can be selectively positioned and oriented within a flow-line or wellbore to harvest energy from the fluid-flow induced vibrations, for example, from 2D or 3D vortex-induced vibrations. In some implementations, the elastic bluff-body configuration includes a bluff body configured to vibrate in response to fluid flow and a harvester coupled to the bluff body configured to generate power in response to the fluid-flow induced vibrations. In some instances, the bluff body can be cylindrical or conical and can be positioned transverse to the flow-path. The bluff body can be other shapes and have other orientations without departing from the scope of the disclosure. In some implementations, the bluff body encloses the harvester or the harvester is located within the volume defined by the inner surface of the bluff body. The harvester can include smart materials (for example, piezoelectric or magnetostrictive materials) or use induction to generate electricity. In some instances, one or more elastic bluff body configurations can operate with power rectification and conditioning equipment to generate usable electrical power.

Figure 1A:
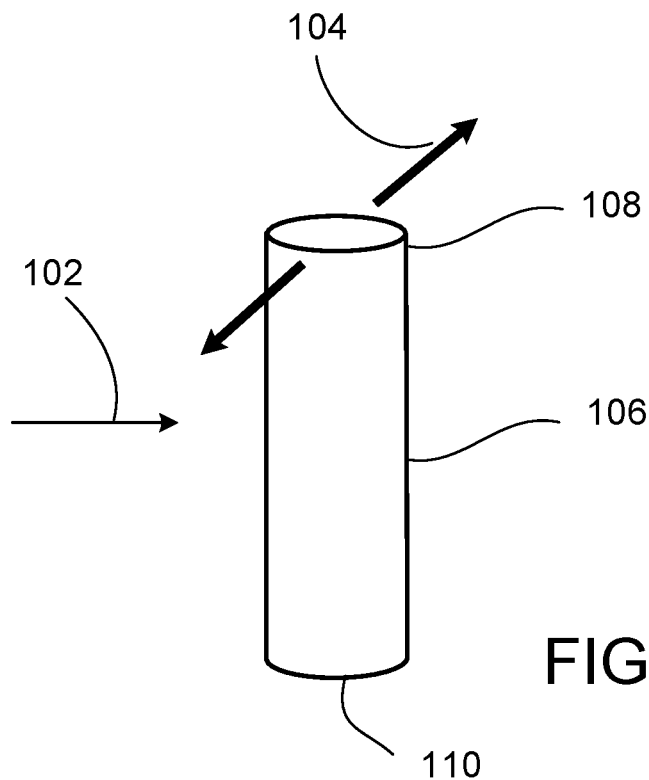
FIGS. 1A-1B are schematic diagrams of an example bluff body in a fluid stream.
Figure 1B:
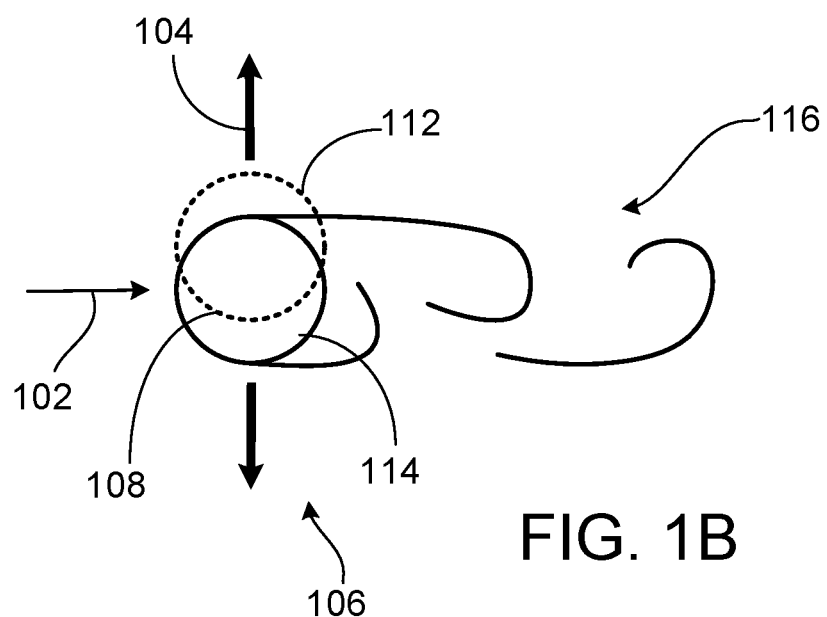

In fluid dynamics, vortex shedding is an oscillating flow that occurs when a fluid such as water or oil flows past a bluff body at a sufficient velocity. In general, a higher flow velocity can produce a greater amount of power. A sufficient velocity to cause oscillations is at least partially dependent upon the size and shape of the bluff body. A bluff body can be a simple cylindrical mass. FIGS. 1A-1B illustrate a flow stream 102 flowing across a cylindrical bluff body 106 and inducing a vibration/oscillation 104. As illustrated, the bluff body 106 is positioned transverse to the fluid flow 102. In response to the fluid flow 102, vortexes 116 are created on a downstream side of the body 106 and detach periodically from either side of the body 106. This repeating pattern of swirling vortexes 116 is also called a Kármán vortex street. Thus, flow vibrations/oscillations 104 are generated downstream of the bluff body 106 because of the vortexes 116. The vibrations/oscillations 104 are also called vortex-induced vibrations, flow induced vibrations, or vortex shedding. If the bluff body 106 is flexible or flexibly mounted at a first end 110, then the oscillating vortexes 116 can cause a second, unattached end 108 to oscillate between a first position 112 and a second position 114. The vibrations/oscillations 104 can occur transverse to the flow path, and can be converted into usable energy. If the frequency of vortex shedding matches the resonance frequency of the structure, the structure can begin to resonate, vibrating with harmonic oscillations driven by the energy of the flow. This phenomenon is called lock-in.

Figure 2A:
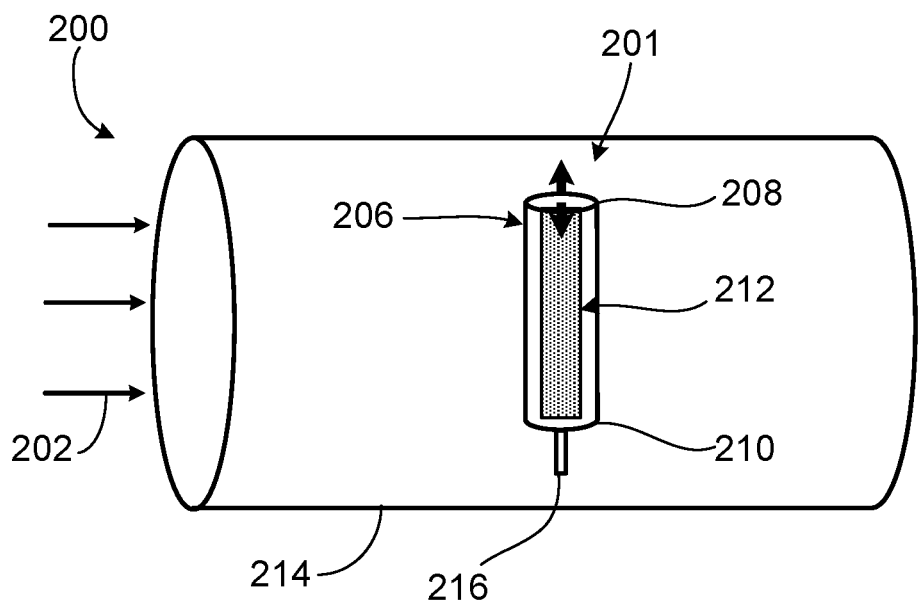
FIG. 2A is an example elastic bluff body positioned in a flow-line.
Figure 2B:
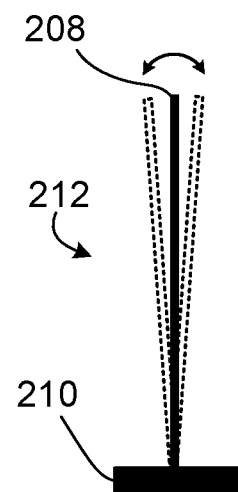
FIG. 2B is an example cantilever-beam-style harvester.

FIGS. 2A-2B illustrate an example piezoelectric energy harvesting system 200 utilizing piezoelectric material to generate power in accordance with some aspects of the present disclosure. For example, the piezoelectric harvesting system 200 can uses piezoelectric material to generate electricity in response to a Kármán vortex street. In some implementations, the piezoelectric harvesting system 200 can generate electricity in response to irregular patterns without departing from the scope of the disclosure. As illustrated, the piezoelectric harvesting system 200 includes an elastic bluff-body device 201 mounted on an inner surface of the flow-line 214 and in the fluid flow 202 and is configured to generate electricity from vortex shedding.

In this implementation, the elastic bluff body device 201 includes an elastic bluff body 206, a piezoelectric harvester 212 coupled to and located within the elastic bluff body 206, and an elastic mount 216 that attaches a first end 210 of the bluff body 206 to an inner surface of the flow-line 214. The second end 108 of the bluff body 206 is unattached. As illustrated, the elastic bluff body 206 is oriented transverse to the fluid flow 202. The elastic bluff body 206 can have other orientations relative to the fluid flow 202 without departing from the scope of the disclosure. While the illustrated implementation utilizes a cylinder for the bluff body 206, any number of shapes can be used without departing from the scope of the disclosure. The elastic bluff body 206 can be made of PEEK, Viton, or any other material appropriate for downhole deployment. The unattached end can be closed. In some implementations, a diameter of the elastic bluff body 206 can be ten to twenty percent of the total internal diameter of the flow-line 214. The bluff body 206 can generate vortex shedding when a speed of the fluid flow 202 is above a predefined threshold and vibrates in response to the vortex shedding. For example, the bluff body 206 can oscillate transverse to the flow 202 in response to the vortex shedding. In some implementations, a flowrate within the flow-line 214 can be between one thousand barrels per day and six thousand barrels per day. The flow velocity at these flowrates is dependent upon the cross-sectional area of the flow-line 214.

Vibrations in the bluff body 206 can induce vibrations in the piezoelectric harvester 212, and, in response to the vibrations, the piezoelectric harvester 212 can generate power. For example, the piezoelectric harvester 212 can generate a few hundred milli-watts of power or more. If a number of energy harvesters are used in a cooperative manner, as described later in this disclosure, the total amount of power depends on the total number of energy harvesters used. In the illustrated implementation, the piezoelectric harvester 212 includes a cantilever beam that includes a piezoelectric material. In these instances, the piezoelectric material converts the cantilever's oscillations into electrical power. When the bluff body 206 vibrates at a specified threshold, the piezoelectric harvester 212 vibrates at its resonance frequency. The resonance frequency can include a wide range of frequencies. In some implementations, the piezoelectric harvester 212 can vibrate at a frequency of 10 hertz. The piezoelectric harvester 212 can vibrate at frequencies above or below 10 hertz without departing from the scope of the disclosure. The illustrated implementation can be utilized within a wellbore, a pipeline, or any other flow-line.

In some aspects of operation, the elastic bluff body device 201 is attached or otherwise mounted to the inner surface of the flow-line 214 using the elastic mount 216, and the elastic bluff-body 206 is oriented transverse to the fluid flow 202. When the velocity of the fluid flow 202 is above a predefined threshold, the elastic bluff body 206 can generate vortex shedding that induces vibrations in the elastic bluff body 206. Vibrations in the elastic bluff-body 206 can induce vibrations in the piezoelectric harvester 212. In response to the vibrations, the piezoelectric harvester 212 can generate electricity.

Figure 3A:
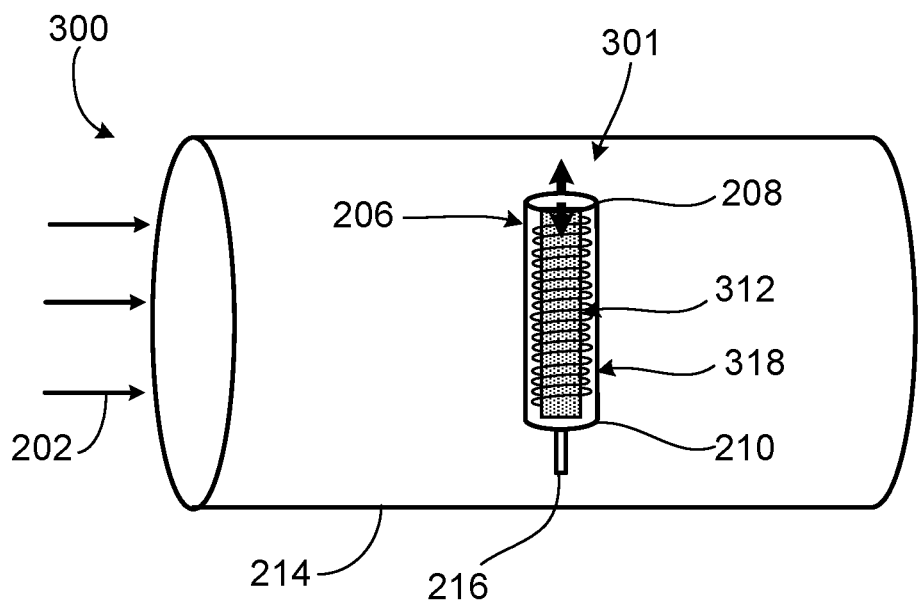
FIG. 3A is an example elastic bluff body positioned in a flow-line.
Figure 3B:
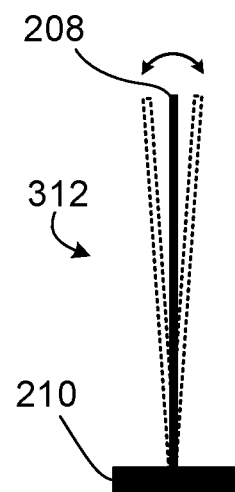
FIG. 3B is an example cantilever-beam-style harvester.

FIGS. 3A-3B illustrate an example magnetostrictive harvesting system 300 utilizing magnetostrictive material to generate power in accordance with some aspects of the present disclosure. For example, the magnetostrictive material can include Galfenol, cobalt, or other magnetostrictive materials. In general, a magnetostrictive material changes its magnetic field when a mechanical stress is applied on the material, and a coil can be used around the material to generate current as the magnetic field changes. As a result of the changing magnetic field, the magnetostrictive harvesting system 300 can generate electricity in response to a Kármán vortex street as well as generate electricity in response to irregular patterns without departing from the scope of the disclosure. In contrast to the elastic bluff body device 201, the piezoelectric harvester 212 is replaced with a magnetostrictive harvester 312 and an electrical coil 318. As the flow 202 interacts with the bluff body 206, the bluff body 206 vibrates. Vibrations in the bluff body 206 can induce vibrations in the magnetostrictive harvester 312 causing a changing magnetic flus that induces electricity in the electrical coil 318. In some implementations, the magnetostrictive harvester 312 can be designed such that the resonance frequency of the harvester 312 matches the oscillation frequency of the bluff body 206 and increased power output can be achieved compared with other frequencies.

Figure 4:
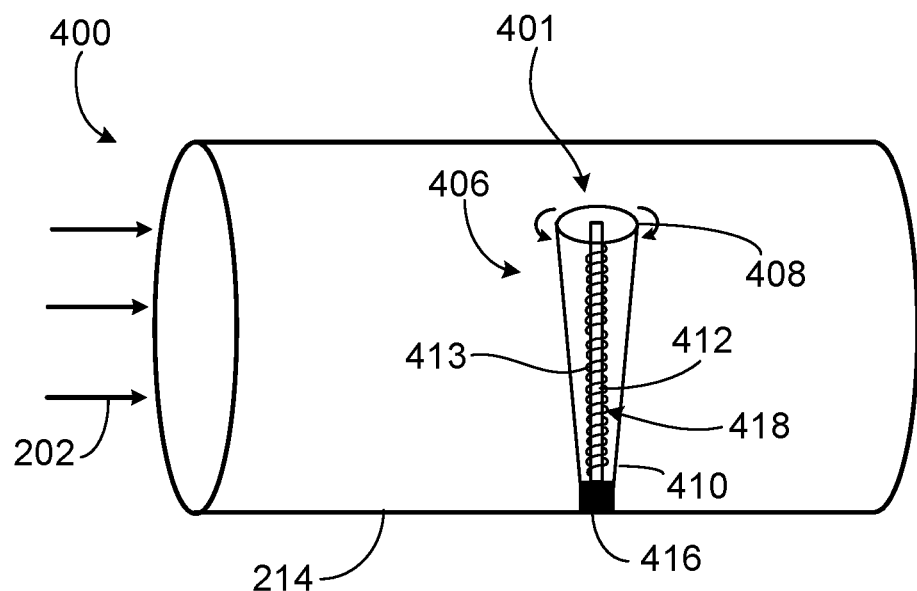
FIG. 4 is an example elastic bluff body positioned in a flow-line.

FIG. 4 illustrates a magnetic-induction harvesting system 400 utilizing magnetic induction to generate power in accordance with some aspects of the present disclosure. In the illustrated implementation, the magnetic-induction harvesting system 400 uses magnetic induction to generate power independent of moving parts such as gears or bearings. The illustrated elastic bluff-body device 401 includes a bluff body 406 that is conical or tapered and an inner fixed cylinder 412 coupled to the conical bluff body 406. The inner fixed cylinder 412 includes an iron core 413 and an electrical coil 418 wrapped around the iron core 413. A first end 410 of the bluff body 406 is elastically mounted to an inner wall of the flow-line 214 using the mount 416, and the first end 410 has a diameter smaller than a second end 408 of the bluff body 406. As a result of the elastic mount, the body of the bluff body 406 can move in response to the fluid flow 202. In some conditions, the tapered or conical bluff body 206 can produce 3D oscillations as compared to 1D that a simple cylinder can produce in the same conditions. In the illustrated implementation, the inner cylinder 412 has a fixed diameter in contrast to the outer cylinder, i.e. the bluff body 406, that is tapered or conical and hollow. The elastic bluff-body device 401 may be oriented transverse to the fluid flow 202 and 3D oscillations of the outer cylinder can occur in response to vortex shedding and lock-in phenomenon. The oscillation frequency of the bluff body 406 can, in some implementations, match the vortex shedding frequency. The outer cylinder can be a light but ruggedized material to facilitate oscillation. Many ruggedized materials can be used, such as stainless steel, PEEK, Viton, or any other rugged material appropriate for the service.

In some aspects of operation, a magnetic field is used to converts mechanical energy to electrical energy using a similar concept as an alternator. The coil 418 attached to oscillating/rotating mass traverses a magnetic field that is established by a stationary magnet. The magnetic flux around coil 418 changes, which induces a voltage according to Faraday's law. Another way is to keep the coil 418 fixed and move the magnetic structure, which can be more advantageous and can result in increased power output. For example, the inner cylinder 412 may be fixed, and the rotating bluff body 406 may produce the changing magnetic field. Moreover, the amount of electricity generated depends upon the strength of the magnetic field, the velocity of the relative motion and the number of turns of the coil. The magnetic field may be produced by permanent magnets, or by a field coil electromagnet.

Figure 5:
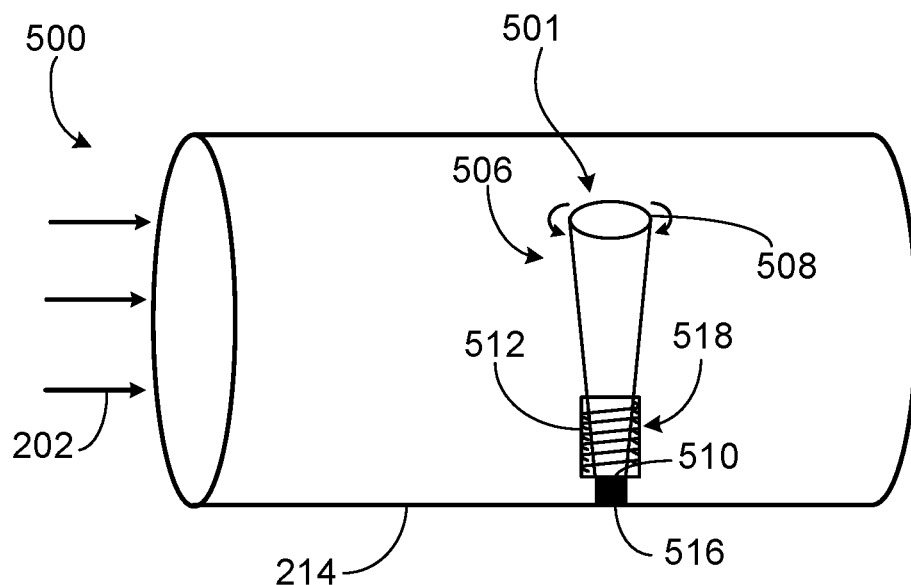
FIG. 5 is an example elastic bluff body positioned in a flow-line.

FIG. 5 illustrates an example magnetic-induction harvesting system 500 utilizing the principles previously described in accordance with some aspects of the present disclosure. The illustrated, elastic bluff-body device 501 includes a bluff body 506 that is conical or tapered and an outer fixed cylinder 512 coupled to the conical bluff body 506. The outer fixed cylinder 512 includes an electrical coil 518 wrapped around the outer circumference of the fixed cylinder 512. A first end 510 of the bluff body 506 is elastically mounted to an inner wall of the flow-line 214 using the mount 516, and the first end 510 has a diameter smaller than a second end 508 of the bluff body 506. As a result of the elastic mount, the body of the bluff body 506 can move in response to the fluid flow 202. In some conditions, the tapered or conical bluff body 206 can produce 3D oscillations as compared to 1D that a simple cylinder can produce in the same conditions. In the illustrated implementation, the outer cylinder 512 has a fixed diameter in contrast to the inner cone, i.e. the bluff body 506, that is tapered or conical. The elastic bluff-body device 501 may be oriented transverse to the fluid flow 202. 3D oscillations of the outer cylinder can occur in response to vortex shedding and lock-in phenomenon. The oscillation frequency of the bluff body 506 can, in some implementations, match the vortex shedding frequency. The outer cylinder can be a light but ruggedized material to facilitate oscillation.

In some aspects of operation, a magnetic field is used to converts mechanical energy to electrical energy using a similar concept as an alternator. The coil 518 attached to oscillating/rotating mass traverses a magnetic field that is established by a stationary magnet. The magnetic flux around coil 518 changes, which induces a voltage according to Faraday's law. Another way is to keep the coil 518 fixed and move the magnetic structure, which can be more advantageous and can result in increased power output. For example, the outer cylinder 512 may be fixed, and the rotating bluff body 506 may produce the changing magnetic field. Moreover, the amount of electricity generated depends upon the strength of the magnetic field, the velocity of the relative motion and the number of turns of the coil. The magnetic field may be produced by permanent magnets, or by a field coil electromagnet.

Figure 6:
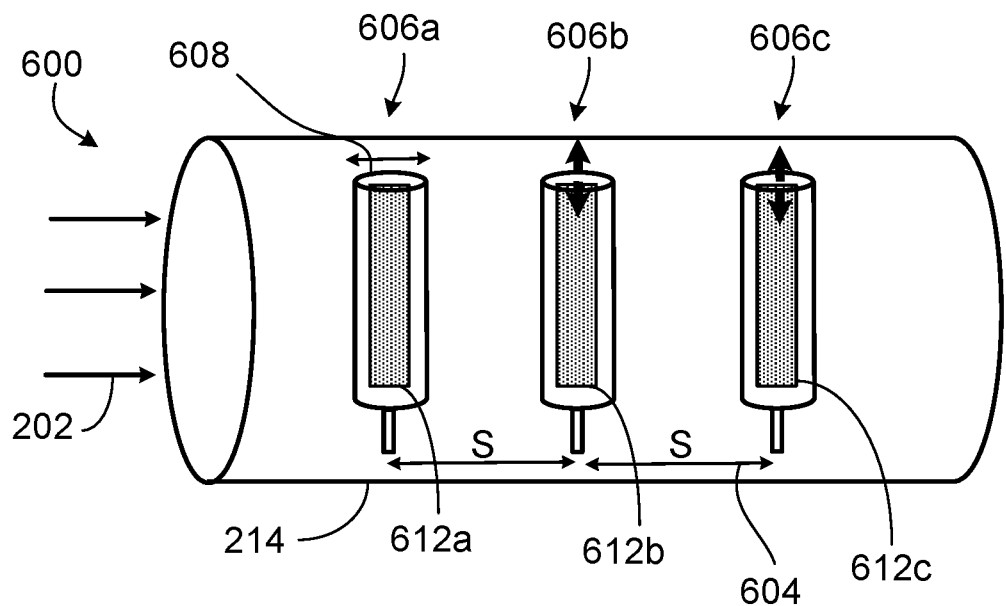
FIG. 6 is an example set of elastic bluff bodies positioned in a flow-line.

FIG. 6 illustrates an example energy harvesting system 600 utilizing the principles previously described in accordance with some aspects of the present disclosure. As illustrated, the example system 600 includes multiple bluff bodies that can be used to generate power. A first elastic bluff body 606a, a second elastic bluff body 606b, and a third elastic bluff body 606c are positioned substantially parallel to each other (within standard manufacturing tolerances) within the flow-line 614. The elastic bluff bodies are arranged so that they are in-line with each other at equal distances 604 from one another. All of the bluff bodies are transverse to a flow within a flow-line 614.

In some aspects of operation, a first bluff body 606a, a second bluff body 606b, and a third bluff body 606c have substantially identical natural frequencies. However, one or more of the first bluff body 606a, the second bluff body 606b, and the third bluff body 606c, may have different natural frequencies. The distance 604 between each of the bluff bodies 606a-c can be selected so that the vortex shedding of the previous bluff body in the flow path induces vibrations in the following bluff body. In other words, each bluff body can be positioned at an appropriate distance apart from one another for a synchronous vortex shedding mode to occur. Each of the elastic bluff bodies is connected to the flow-line through an elastic mount, such as the elastic mount 216. Each of the elastic bluff bodies can include any of the implementations previously disclosed in this disclosure. In some implementations, the multiple bluff bodies can each include different implementations. For example, the first bluff-body 606a can include the elastic bluff-body device 201, the second bluff body 606b can include the elastic bluff-body device 301, and the third bluff body 606c can include the elastic bluff-body device 401.

In some aspects of operation, the elastic bluff bodies are attached to the inner surface of the flow-line 614 using elastic mounts, such as elastic mount 216, and the bluff bodies are oriented transverse to the fluid flow 602. When the velocity of the fluid flow 602 is above a predefined threshold, the bluff bodies can generate vortex shedding that produce vibrations in the elastic bluff bodies 606a-c. Vibrations in the bluff bodies can induce vibrations in the harvesters 612a-c coupled to each respective bluff body. In response to the vibrations, the harvesters can generate electricity.

Figure 7:
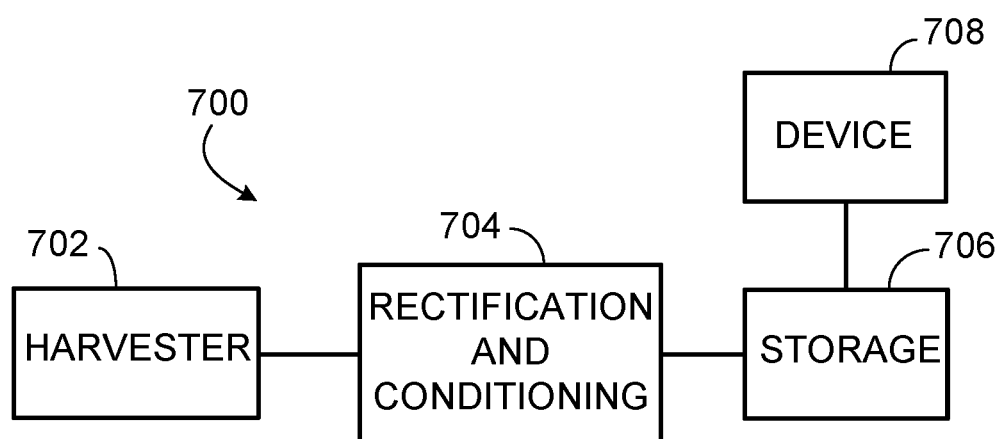
FIG. 7 is a block diagram of a power harvesting system.

A power harvesting system that harvests power from vibrations can require auxiliary circuitry for practical use. FIG. 7 shows a block diagram of an example power harvesting system 700 that can be used to power a device, such as a downhole sensor. In the illustrated implementation, the power harvesting system 700 includes a harvester 702 electrically coupled and feeds power to a rectification and conditioning circuit 704. The harvester 702 can be any harvester that harvests power from vibration, such as the piezoelectric harvester, the magnetostrictive harvester, the induction harvester, or any other harvester previously described or capable of harvesting power from vibration. The power rectification and conditioning circuit 704 can rectify and condition the power produced by the harvesters so that the power can be used by a desired end device. For example, the rectification and conditioning circuit 704 can convert a sporadic electrical signal from the harvester into a low-ripple direct current. The rectified and conditioned power can then be stored within a storage device 706 coupled to the rectification and conditioning circuit 704, such as a battery or super capacitor. In some implementations, the storage device 706 can be in close proximity to the harvester 702. For example, the harvester 702 and the storage device 706 can both be located within the same wellbore. The power stored within the storage device 706 can be used to provide power to an end user device 708, such as a downhole sensor or a downhole communication device.

Figure 8:
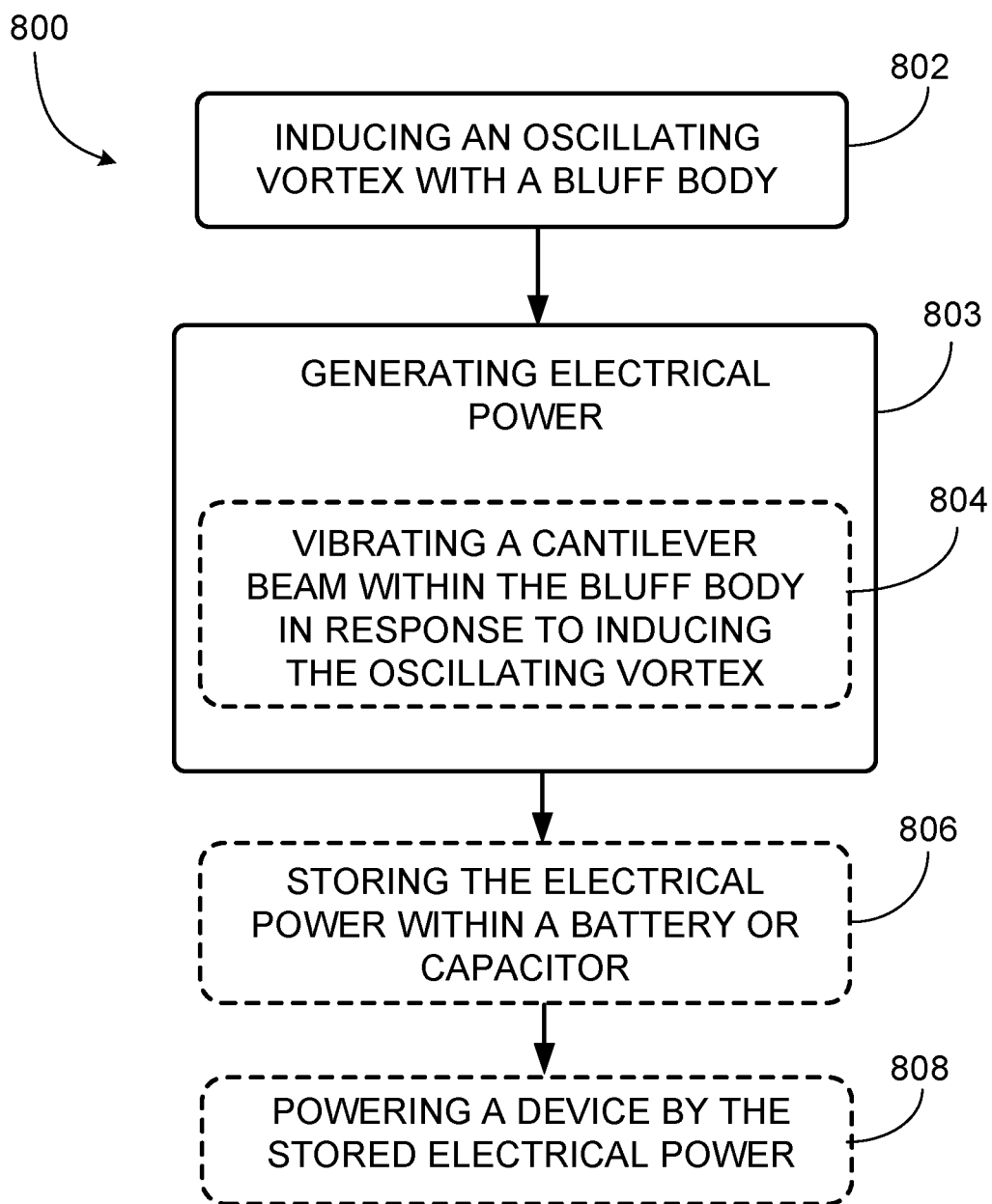
FIG. 8 is a flowchart of an example method to harvest energy from a fluid flow.

FIG. 8 shows a flowchart of an example method 800 for harvesting power from a fluid flow. At 802, an oscillating vortex is induced by a bluff body and a harvester coupled to the bluff body in response to flowing a fluid across the bluff body. At 803, electrical power is generated in response to inducing the oscillating vortex. At 804, in some implementations, generating electrical power can include vibrating a cantilever beam within the bluff body in response to the oscillating vortex. Once the electrical power is generated, at 806, the electrical power can be stored within a battery, a capacitor, or any other electrical storage device. At 808, the electrical power stored within the electrical storage device can power a device, such as a downhole sensor, actuator, or a communication device. While the power harvesting system described within this disclosure is often described in the context of a wellbore, implementations can also exist in general flow-lines. For example, the system could be utilized for remote pipeline condition monitoring, wireless flow metering, remote $H_2S$ monitoring, and any other application where harvesting power can be useful.

While this disclosure contains many specific implementation details, these should not be construed as limitations on the scope of any disclosures or of what can be claimed, but rather as descriptions of features specific to particular implementations. Certain features that are described in this disclosure in the context of separate implementations can also be implemented in combination in a single implementation. Conversely, various features that are described in the context of a single implementation can also be implemented in multiple implementations separately or in any suitable subcombination. Moreover, although features can be described above as acting in certain combinations and even initially claimed as such, one or more features from a claimed combination can in some cases be excised from the combination, and the claimed combination can be directed to a subcombination or variation of a subcombination.

Thus, particular implementations of the subject matter have been described. Other implementations are within the scope of the following claims. In some cases, the actions recited in the claims can be performed in a different order and still achieve desirable results. In addition, the processes depicted in the accompanying figures do not necessarily require the particular order shown, or sequential order, to achieve desirable results.

What is claimed is:

1. An elastic bluff body, comprising:
   an elastic mount with a central axis;
   a conical bluff body with a central axis, the conical bluff body fixedly attached to the elastic mount, the central axis of the elastic mount and the central axis of the conical bluff body being aligned, the conical bluff body being configured to generate vortex shedding when the elastic mount orients the conical bluff body in a flow-line traverse to a fluid flow and vibrates in response to the vortex shedding, wherein the conical bluff body comprises a permanent magnet or electromagnet; and
   a harvester coupled to the conical bluff body and aligned with the central axis of the conical bluff body, the harvester comprising a cylinder arranged outside of and aligned with the central axis of the conical bluff body, and a metallic coil circling a circumference of the cylinder, the harvester configured to generate power above a specified threshold in response to the vibration.

2. The elastic bluff body of claim 1, wherein the harvester vibrates at a resonance frequency of the elastic bluff body.

3. The elastic bluff body of claim 1, wherein the flow-line comprises a wellbore.

* * * * *